(12) United States Patent
Winkler et al.

(10) Patent No.: US 12,082,512 B2
(45) Date of Patent: Sep. 3, 2024

(54) SEMICONDUCTOR-SUPERCONDUCTOR HYBRID DEVICE

(71) Applicant: Microsoft Technology Licensing, LLC, Redmond, WA (US)

(72) Inventors: Georg Wolfgang Winkler, Santa Barbara, CA (US); Roman Mykolayovych Lutchyn, Santa Barbara, CA (US); Leonardus Petrus Kouwenhoven, The Hague (NL); Farhad Karimi, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/662,586

(22) Filed: Oct. 24, 2019

(65) Prior Publication Data

US 2021/0126180 A1 Apr. 29, 2021

(51) Int. Cl.
*H01L 39/10* (2006.01)
*G06N 10/00* (2022.01)
(Continued)

(52) U.S. Cl.
CPC ............. *H10N 60/84* (2023.02); *G06N 10/00* (2019.01); *H10N 60/01* (2023.02); *H10N 60/30* (2023.02)

(58) Field of Classification Search
CPC ......... H01L 21/02461; H01L 21/02463; H01L 21/02466; H01L 21/02543;
(Continued)

(56) References Cited

U.S. PATENT DOCUMENTS 3,500,137 A * 3/1970 Pierce .................... H01L 29/00
 327/527
4,225,409 A * 9/1980 Minomura ............. C23C 14/06
 204/192.15
(Continued)

FOREIGN PATENT DOCUMENTS

CN 102985935 A 3/2013
CN 106575667 A 7/2020
(Continued)

OTHER PUBLICATIONS

Sasakura et al., "Enhanced Photon Generation in a Nb/n-InGaAs/p-InP Superconductor/Semiconductor-Diode Light Emitting Device," Physical Review Letters 107 (2011) 157403.*
(Continued)

*Primary Examiner* — Jay C Kim
(74) *Attorney, Agent, or Firm* — Ranjeev Singh; Singh Law, PLLC (57) ABSTRACT

A semiconductor-superconductor hybrid device comprises a semiconductor layer and a superconductor layer. The superconductor layer is arranged over an edge of the semiconductor layer so as to enable energy level hybridisation between the semiconductor layer and the superconductor layer. The semiconductor layer is arranged in a sandwich structure between first and second insulating layers, each insulating layer being in contact with a respective opposed face of the semiconductor layer. This configuration may allow for good control over the geometry of the semiconductor layer and may improve tolerance to manufacturing variations. The device may be useful in a quantum computer. Also provided is a method of manufacturing the device, and a method of inducing topological behaviour in the device.

16 Claims, 6 Drawing Sheets

(51) Int. Cl.
*H10N 60/01* (2023.01)
*H10N 60/30* (2023.01)
*H10N 60/84* (2023.01)

(58) Field of Classification Search
CPC ......... H01L 21/02546; H01L 21/02549; H01L 23/66; H01L 39/2964; G06N 10/00; H10N 60/01; H10N 60/30; H10N 60/84
See application file for complete search history.

(56) References Cited

U.S. PATENT DOCUMENTS

| | | | |
|---|---|---|---|
| 4,843,446 A | 6/1989 | Nishino et al. | |
| 4,860,067 A | 8/1989 | Jackson et al. | |
| 4,884,111 A | 11/1989 | Nishino et al. | |
| 4,888,629 A | 12/1989 | Harada et al. | |
| 4,961,194 A | 10/1990 | Kuroda et al. | |
| 5,012,303 A | 4/1991 | Tamura | |
| 5,094,974 A * | 3/1992 | Grunthaner | H01L 21/02381 117/105 |
| 5,126,315 A | 6/1992 | Nishino et al. | |
| 5,138,401 A * | 8/1992 | Yamazaki | H01L 29/4966 257/E39.02 |
| 5,250,506 A | 10/1993 | Saitoh | |
| 5,272,358 A | 12/1993 | Nishino et al. | |
| 5,318,952 A * | 6/1994 | Hato | H01L 39/228 257/36 |
| 5,380,704 A * | 1/1995 | Tarutani | H10N 60/207 257/E29.151 |
| 5,388,068 A | 2/1995 | Ghoshal et al. | |
| 5,550,389 A | 8/1996 | Nishino et al. | |
| 5,658,825 A | 8/1997 | Razeghi | |
| 5,760,463 A * | 6/1998 | Hato | H01L 23/498 257/37 |
| 5,793,055 A * | 8/1998 | Kastalsky | H01L 29/772 257/192 |
| 5,871,586 A * | 2/1999 | Crawley | C30B 25/14 118/715 |
| 5,872,368 A * | 2/1999 | Osofsky | H10N 60/207 505/190 |
| 6,229,154 B1 * | 5/2001 | Nojima | G01J 5/10 257/30 |
| 6,660,646 B1 * | 12/2003 | Elmadjian | H01L 21/0273 438/709 |
| 6,753,546 B2 | 6/2004 | Tzalenchuk et al. | |
| 7,009,875 B2 | 3/2006 | Johnson | |
| 7,212,433 B2 | 5/2007 | Johnson | |
| 8,093,897 B2 | 1/2012 | Pan | |
| 8,936,976 B2 | 1/2015 | Radosavljevic et al. | |
| 9,000,488 B2 | 4/2015 | Endoh | |
| 9,040,959 B2 | 5/2015 | Lutchyn et al. | |
| 9,123,741 B2 | 9/2015 | Lau et al. | |
| 9,171,920 B2 | 10/2015 | Chang et al. | |
| 9,252,237 B2 | 2/2016 | Doornbos et al. | |
| 9,400,127 B2 | 7/2016 | Gervais et al. | |
| 9,489,634 B2 * | 11/2016 | Bonderson | G06N 10/00 |
| 9,496,471 B2 * | 11/2016 | Akimoto | H01L 33/44 |
| 9,713,199 B2 * | 7/2017 | Freedman | G06N 10/00 |
| 9,786,743 B2 | 10/2017 | Endoh | |
| 9,804,205 B2 | 10/2017 | Duvjnak et al. | |
| 10,020,438 B2 * | 7/2018 | Yazdani | H01L 39/22 |
| 10,032,950 B2 * | 7/2018 | Campbell | H01L 31/03046 |
| 10,079,297 B2 | 9/2018 | Endoh | |
| 10,133,984 B2 * | 11/2018 | Clarke | G06N 10/00 |
| 10,134,889 B2 | 11/2018 | Takahashi | |
| 10,177,297 B2 * | 1/2019 | Marcus | H01L 29/413 |
| 10,367,132 B2 | 7/2019 | Krogstrup et al. | |
| 10,389,353 B2 * | 8/2019 | Kondo | H01L 31/125 |
| 10,403,809 B2 * | 9/2019 | Krogstrup | C30B 29/40 |
| 10,477,635 B1 * | 11/2019 | Kondo | H05B 45/44 |
| 10,593,879 B2 * | 3/2020 | Schrade | B82Y 10/00 |
| 10,720,562 B2 | 7/2020 | Krogstrup et al. | |
| 10,809,642 B2 * | 10/2020 | Kondo | H01S 5/42 |
| 10,879,464 B2 * | 12/2020 | Krogstrup Jeppesen | H01L 29/20 |
| 10,910,882 B2 * | 2/2021 | Smith | H02J 50/80 |
| 11,100,419 B2 * | 8/2021 | Moodera | H10N 60/10 |
| 11,201,273 B2 * | 12/2021 | Pikulin | B82Y 10/00 |
| 11,575,006 B2 * | 2/2023 | Duan | H10K 10/484 |
| 11,621,386 B2 * | 4/2023 | Hart | H10N 60/805 257/36 |
| 2004/0161010 A1 * | 8/2004 | Matsumura | H01S 5/22 372/46.01 |
| 2013/0295757 A1 | 11/2013 | Xu et al. | |
| 2015/0162402 A1 | 6/2015 | Yasuzato | |
| 2015/0276950 A1 * | 10/2015 | Bensaoula | H01L 31/115 257/76 |
| 2017/0214214 A1 * | 7/2017 | Yang | H01S 5/3214 |
| 2017/0277065 A1 * | 9/2017 | Kondo | H01L 33/105 |
| 2018/0309890 A1 * | 10/2018 | Kondo | H04N 1/00891 |
| 2018/0342635 A1 * | 11/2018 | Balasekaran | H01L 31/022408 |
| 2019/0115459 A1 | 4/2019 | Kim | |
| 2020/0077478 A1 * | 3/2020 | Kondo | H01L 27/32 |
| 2020/0287120 A1 | 9/2020 | Pikulin et al. | |
| 2020/0328339 A1 * | 10/2020 | Shabani | H01L 39/223 |
| 2021/0083167 A1 * | 3/2021 | Jespersen | H01L 29/66439 |
| 2021/0126180 A1 | 4/2021 | Winkler et al. | |
| 2021/0126181 A1 | 4/2021 | Winkler et al. | |

FOREIGN PATENT DOCUMENTS

| | | |
|---|---|---|
| EP | 0405677 A2 | 9/1995 |
| JP | S61275190 A | 12/1986 |
| JP | H0745878 A | 2/1995 |
| KR | 20120130359 A | 12/2012 |
| WO | 2019001753 A1 | 1/2019 |

OTHER PUBLICATIONS

"Clusters of aluminum metal atoms become superconductive at surprisingly high temperatures," Science Daily (2015).*
Ikushima et al., "Superconductivity in niobium and niobium-tantalum alloys," Journal of Physics and Chemistry of Solids 30 (1969) pp. 873-879.*
Castelvecchi, "Evidence of Elusive Majorana Particle Dies With Retraction," Nature 591 (2021) pp. 354-355.*
Antipov et al., "Effects of Gate-Induced Electric Fields on Semiconductor Majorana Nanowires," Physical Review X 8 (2018) 031041.*
Ke et al., "Ballistic superconductivity and tunable π-junctions in InSb quantum wells," Nature Communications (2019) 10: 3764.*
Deng et al., "Nonlocality of Majorana modes in hybrid nanowires," Physical Review B 98 (2018) 085125 (2018).*
Liu et al., "Electronic properties of InAs/EuS/Al hybrid nanowires," Physical Review B 104 (2021) 014516.*
Stanescu et al., "Majorana Fermions in Semiconductor Nanowires," *Physical Review B*, vol. 84, No. 14, 29 pp. (Oct. 2011).
U.S. Appl. No. 16/120,433, filed Sep. 3, 2018, 57 pp.
U.S. Appl. No. 16/246,287, filed Jan. 11, 2019, 28 pp.
Winkler et al., "A unified numerical approach to topological semiconductor-superconductor heterostructures," *Physical Review B*, vol. 99, No. 24, 16 pp. (Jun. 2019).
Non-Final Office Action issued in U.S. Appl. No. 16/662,611, mailed Jan. 21, 2021, 16 pages.
Casparis et al., "Superconducting Gatemon Qubit based on a Proximitized Two-Dimensional Electron Gas," Journal of Nature Nanotechnology, vol. 13, Issue 10, Oct. 2018, pp. 915-919.
Kjaergaard et al., "Quantized Conductance Doubling and Hard Gap in a Two-Dimensional Semiconductor-Superconductor Heterostructure," Repository of arXiv:1603.01852v1, Mar. 6, 2016, 10 Pages.
Krogstrup et al., "Epitaxy of Semiconductor-Superconductor Nanowires," Journal of Nature Materials, vol. 14, Issue 4, Apr. 2015, pp. 400-406.
Liu et al., "Semiconductor—Ferromagnetic Insulator—Superconductor Nanowires: Stray Field and Exchange Field," Repository of arXiv:1910.03364v1, Oct. 8, 2019, 29 Pages.

(56) References Cited

OTHER PUBLICATIONS

International Search Report & Written Opinion issued in PCT Application No. PCT/US2020/056654, mailed Jan. 28, 2021, 32 Pages.
International Search Report & Written Opinion issued in PCT Application No. PCT/US2020/056665, mailed Feb. 2, 2021, 41 Pages.
Suominen et al., "Scalable Majorana Devices," Repository of arXiv:1703.03699v1, Mar. 10, 2017, 13 Pages.
Takayanagi et al., "Submicron Gate-Fitted Superconducting Junction Using a Two-Dimensional Electron Gas," Journal of Japanese Journal of Applied Physics, vol. 34, Issue 12B, Dec. 1995, pp. 6977-6986.
Karzig et al., "Scalable designs for quasiparticle-poisoning-protected topological quantum computation with Majorana zero modes," Physical Review B 95, No. 23 (2017): pp. 235305-23525.
"Non Final Office Action Issued in U.S. Appl. No. 16/662,611", Mailed Date: Feb. 8, 2022, 18 Pages.
Chang, Willy, "Superconducting Proximity Effect in InAs Nanowires," Ph.D. Thesis at Harvard University, 192 pages (2014).
Final Office Action issued in U.S. Appl. No. 16/662,611, mailed on Jun. 11, 2021, 18 pages.
Kawaji et al., "Superconductivity in InAs Surfaces," *Journal of the Physical Society of Japan*, vol. 39, No. 6, 1 page (Dec. 1975).
"Final Office Action Issued in U.S. Appl. No. 16/662,611", Mailed Date: Nov. 29, 2022, 19 Pages.
Krogstrup, et al., "Epitaxy of Semiconductor-Superconductor Nanowires", In Repository of arXiv:1411.6254v2, Nov. 26, 2014, 40 Pages.
Shabani, et al., "Two-dimensional Epitaxial Superconductor-Semiconductor Heterostructures: A Platform for Topological Superconducting Networks", In Journal of Physical Review B, vol. 93, Issue 15, Apr. 1, 2016, 7 Pages.
Taupin, et al., "InAs Nanowire with Epitaxial Aluminum as a Single-Electron Transistor with Fixed Tunnel Barriers", In Journal of Physical Review Applied, vol. 6, Issue 5, Nov. 28, 2016, 7 Pages.
"Non Final Office Action Issued in U.S. Appl. No. 16/662,611", Mailed Date: Jul. 26, 2023, 10 Pages.
Office Action Received for Chinese Application No. 202080073351.9, mailed on Mar. 26, 2024, 15 pages (English Translation Provided).

* cited by examiner

SEMICONDUCTOR-SUPERCONDUCTOR HYBRID DEVICE

BACKGROUND

Topological quantum computing is based on the phenomenon whereby non-abelian anyons, in the form of "Majorana zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to a temperature that induces superconducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

To induce an MZM the device is cooled to a temperature where the superconductor (e.g. Aluminium, Al) exhibits superconducting behaviour. The superconductor causes a proximity effect in the adjacent semiconductor, whereby a region of the semiconductor near the interface with the superconductor also exhibits superconducting properties. I.e. a topological phase behaviour is induced in the adjacent semiconductor as well as the superconductor. It is in this region of the semiconductor where the MZMs are formed.

Another condition for inducing the topological phase where MZMs can form is the application of a magnetic field in order to lift the spin degeneracy in the semiconductor. Degeneracy in the context of a quantum system refers to the case where different quantum states have the same energy level. Lifting the degeneracy means causing such states to adopt different energy levels. Spin degeneracy refers to the case where different spin states have the same energy level. Spin degeneracy can be lifted by means of a magnetic field, causing an energy level spilt between the differently spin-polarized electrons. This is known as the Zeeman effect. The g-factor refers to the coefficient between the applied magnetic field and the spin splitting. Typically, the magnetic field is applied by an external electromagnet. However, U.S. patent application Ser. No. 16/246,287 has also disclosed a heterostructure in which a layer of a ferromagnetic insulator is disposed between the superconductor and semiconductor in order to internally apply the magnetic field for lifting the spin degeneracy, without the need for an external magnet. Examples given for the ferromagnetic insulator included compounds of heavy elements in the form of EuS, GdN, $Y_3Fe_5O_{12}$, $Bi_3Fe_5O_{12}$, $YFeO_3$, $Fe_2O_3$, $Fe_3O_4$, GdN, $Sr_2CrReO_6$, $CrBr_3/CrI_3$, $YTiO_3$ (the heavy elements being Europium, Gadolinium, Yttrium, Iron, Strontium and Rhenium).

Inducing MZMs typically also requires gating the nanowire with an electrostatic potential. However, U.S. patent application Ser. No. 16/120,433 has also disclosed a structure which is capable of exhibiting topological behaviour including MZMs without the need for gating. In this case the nanowires have a full shell of superconductor all the way around the perimeter of the nanowire, which obviates the need for gating.

Figure 8:
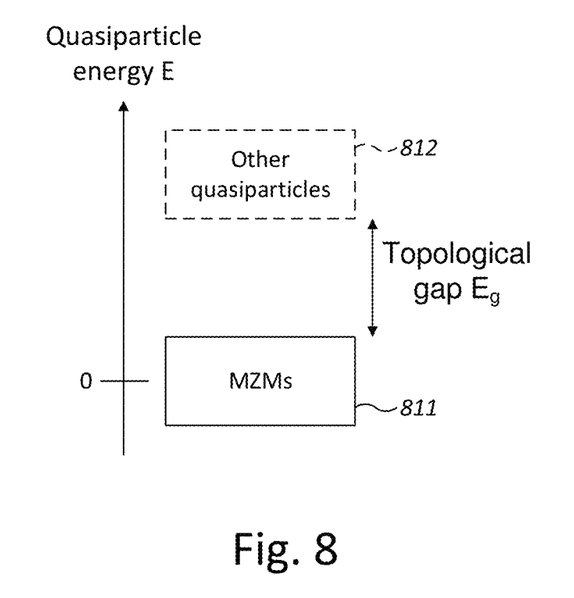
FIG. 8 is a diagram illustrating the concept of a topological gap.
Figure 9:
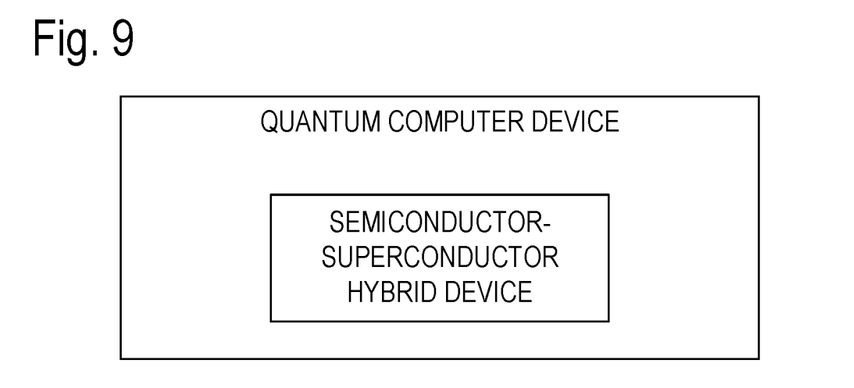
FIG. 9 illustrates a quantum computer device that includes a semiconductor-superconductor hybrid device.

As illustrated in FIG. 8, in order to create good quality devices in which the MZMs are long-lived, it is preferable to have a large topological gap $E_g$. A material in the topological phase (whether a superconductor or a region of proximity-induced superconductivity in a semiconductor) exhibits distinct energy bands: a lower band 811 and an upper band 812. The lower band 811 is a band where the quasiparticle energy E falls in a lower range, and the upper band (or "excitation band") 812 is a band of higher quasiparticle energy. The topological gap $E_g$ is an energy window between the upper and lower bands 811, 812 where no quasiparticles can ex ist due to the quantized (discrete) nature of the quasiparticle energy levels. The lower band 811, upper band 812 and topological gap $E_g$ are analogous to the valence band, conduction band and band gap for electrons in a semiconductor. In the upper, excitation band 812 the quasiparticles can propagate freely through the superconductor (or proximity-induced region in a semiconductor), analogous to the electrons in the valence band in a semiconductor.

The Majoranas, whose states form the MZMs, form the lower band 811. The Majoranas are part of the computational space, i.e. the properties of the system being exploited for the quantum computing application in question. In other words, the MZMs are the operating elements of the qubit. On the other hand, the particle-like excitations (quasiparticles) in the upper band 812 are not part of the computational space. If these quasiparticles cross the topological energy gap $E_g$ into the lower band 811 due to thermal fluctuations, then they will destroy at least some of the MZMs. This is sometimes referred to as "poisoning" the MZMs. The gap Eg provides protection for the MZMs against such poisoning. The probability of a quasiparticle ex isting in the upper band and crossing the gap $E_g$ from the upper to the lower band is proportional to $e^{-E_g/kT}$ where T is temperature and k is the Boltzmann constant. Hence the larger the topological gap, the more protection is afforded to the MZMs against poisoning from the harmful quasiparticles in the upper band 812.

A more detailed treatment of the theory of operation of semiconductor-superconductor hybrid devices is provided by Stanescu et al (Physical Review B 84, 144522 (2011)) and Winkler et al (Physical Review B 99, 245408 (2019)). The content of these documents is hereby incorporated by reference.

SUMMARY

It would be desirable to provide a semiconductor-superconductor hybrid device with a large topological gap, more particularly a topological gap which is as close as possible to the theoretical limit. It would also be desirable to provide a semiconductor-superconductor hybrid device with improved tolerance to manufacturing variations.

A semiconductor-superconductor hybrid device comprises a semiconductor layer and a superconductor layer. The superconductor layer is arranged over an edge of the semiconductor layer so as to enable energy level hybridisation between the semiconductor layer and the superconductor layer. The semiconductor layer is arranged in a sandwich structure between first and second insulating layers, each insulating layer being in contact with a respective opposed face of the semiconductor layer. This configuration may allow for good control over the geometry of the semiconductor layer and may improve tolerance to manufacturing variations. The device may be useful in a quantum computer. Also provided is a method of manufacturing the device, and a method of inducing topological behaviour in the device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which:

FIGS. 1 and 2 are schematic, and are not to scale. The relative proportions of components shown in these FIGS. may be exaggerated for ease of representation.

DETAILED DESCRIPTION

As used herein, the verb 'to comprise' is used as shorthand for 'to include or to consist of'. In other words, although the verb 'to comprise' is intended to be an open term, the replacement of this term with the closed term 'to consist of' is explicitly contemplated, particularly where used in connection with chemical compositions.

Directional terms such as "top", "bottom", "left", "right", "above", "below", "horizontal" and "vertical" are used herein for convenience of description and relate to the semiconductor-superconductor hybrid device in the orientation shown in FIGS. 1 and 2. For the avoidance of any doubt, this terminology is not intended to limit the orientation of the device in an external frame of reference.

As used herein, the term "superconductor" refers to a material which becomes superconductive when cooled to a temperature below a critical temperature, $T_c$, of the material. The use of this term is not intended to limit the temperature of the device.

A "nanowire" as referred to herein is an elongate member having a nano-scale width, and a length-to-width ratio of at least 100, or at least 500, or at least 1000. A typical example of a nanowire has a width in the range 10 to 500 nm, optionally 50 to 100 nm or 75 to 125 nm. Lengths are typically of the order of micrometers, e.g. at least 1 μm, or at least 10 μm. In the present context, the nanowires are typically formed of a semiconductor material.

The term "coupling" in the context of the present disclosure refers in particular to the hybridisation of energy levels.

The content of all documents cited herein is hereby incorporated by reference in its entirety.

A first example of a semiconductor-superconductor hybrid device 100 will now be explained with reference to FIG. 1.

The semiconductor-superconductor device 100 includes a semiconductor layer 10 and a superconductor layer 12. The semiconductor layer has an edge 14 and two opposed faces. The edge 14 of the semiconductor layer 10 is, in this example, in direct contact with the superconductor layer 12. At least when the device is in use, there is energy level hybridisation between the semiconductor layer 10 and the superconductor layer 12 in a region near the edge 14.

Semiconductor layer 10 in the present example is a layer of a material having the general formula:

$$InAs_xSb_{1-x} \qquad \text{(Formula 1)}$$

where x is in the range 0 to 1. In other words, semiconductor layer 10 may comprise indium antimonide (x=0), indium monoarsenide (x=1), or a ternary mixture comprising 50% indium on a molar basis and variable proportions of arsenic and antimony (0<x<1).

Indium monoarsenide, InAs, has been found to have good handling properties during manufacture of the device, and provides devices with good performance. Indium antimonide, InSb, provides further improvements to device performance but may be more difficult to use during manufacturing processes. The ternary mixtures have intermediate properties between those of the binary compounds InAs and InSb. Improvements in device performance compared to InAs may be observed when x is in the range 0 to 0.7, or 0.01 to 0.7. Values of x in the range 0.35 to 0.45 may provide a particularly good balance of device performance and handling properties. The present example uses indium antimonide as the semiconductor layer 10.

The semiconductor layer 10 has a thickness d in the range 5 nm to 50 nm. Increases in topological gap are observed when using semiconductor layers within thicknesses within this range. Without wishing to be bound by theory, the inventors believe that varying the thickness d may vary the number of occupied energy levels ("sub-bands") and the degree of hybridisation between the semiconductor layer 10 and the superconductor layer 12.

In the present example, superconductor layer 12 is a layer of aluminium. Winkler et al (cited above) report that aluminium couples strongly to InAs and InSb, and that the strength of the coupling may vary depending on the thickness of the superconductor layer. The thickness may be in the range 4 to 10 nm, for example.

The semiconductor-superconductor hybrid device 100 further includes a first insulating layer 16a and a second insulating layer 16b. The first and second insulating layers 16a, 16b are arranged to sandwich the semiconductor layer 10. First insulating layer 16a extends from a substrate 18 on which the device is arranged. In this example, the first insulating layer 16a is formed integrally with the substrate 18. Second insulating layer 16b is arranged as a cap, covering the semiconductor layer 10. The first insulating layer 16a, second insulating layer 16b and semiconductor layer 10 are referred to collectively herein as a sandwich structure.

The first insulating layer 16a spaces the semiconductor layer 10 away from the substrate 16a, and away from bottom corners 26a, 26b between the device and substrate 18. Second insulating layer 16b spaces the semiconductor layer away from the top surface and corners of the device.

In the present example, first and second insulating layers are formed of indium phosphide. Indium phosphide is a semiconductor material, but its semiconducting properties are not used in the context of the present device. Rather, the indium phosphide serves as an insulator. Indium phosphide has a high band gap. There is a large difference in energy between the conduction band of semiconductor layer 10 and the conduction band of indium phosphide. When the device is in use, electrons are trapped in semiconductor layer 10 and do not escape into the insulating layers 16a, 16b.

Other illustrative materials useful for forming the first and second insulating layers are those of the formula $InAl_xAs_{1-x}$ where x is at least 0.1, for example where x is in the range 0.1 to 0.4. A still further class of illustrative materials are those of the formula $InGaQ_xAs_{1-x}$ where x is at least 0.15, for example where x is in the range 0.15 to 0.4.

In the present example, the substrate 18 is formed of indium phosphide.

The semiconductor layer 10 and the superconductor layer 12 are the active, working portions of the device at which useful excitations (such as Majorana zero modes) are induced during operation. The tops and corners of semiconductor devices in general are difficult to manufacture reproducibly. Small variations in device structure may be present in these areas. Likewise, the substrate surface may have small variations. Spacing the active semiconductor layer away from the areas which are difficult to reproduce may make it easier to manufacture devices consistently. Provided that the thickness d and the edge 14 of the device are well-controlled, larger manufacturing variations in other parts of the semiconductor structure may be well tolerated.

The first and second insulating layers 16a, 16b may also serve to trap electrons in the semiconductor layer. This may improve the lifetime of the useful excitations when the device is in use.

The device 100 further comprises a protective layer 22 arranged over the top and a side of the sandwich structure. This layer may protect the device from oxidation, particularly during manufacturing processes. The protective layer 22 may serve as an electrical insulator for preventing flow of current from gate electrode 20 into the device. The material which forms the protective layer 22 is not particularly limited, and may be any of the various protective materials known in the field of semiconductor manufacture. Protective layer 22 is typically of an oxide, such as hafnium oxide.

In the illustrated example, protective layer 22 covers only part of the device. In variants, a protective layer may cover the entirety of the device.

A gate electrode 20 is provided over a side of the sandwich structure, including a second edge of the semiconductor layer 10. The gate electrode 20 is spaced from the semiconductor layer 10 by protective layer 22. In this way, the protective layer 22 prevents or reduces current leakage from the gate electrode 20 into the semiconductor layer 22.

The gate electrode 20 may be formed of any suitable material. The gate electrode is typically not superconductive. The gate electrode may be of gold, or a gold-titanium alloy, for example.

Arranging the gate electrode 20 over the side and/or top of the sandwich structure, referred to herein as a "side-gated semiconductor-superconductor hybrid device" or a "top-gated semiconductor-superconductor hybrid device", respectively, may make the device easier to manufacture in comparison with the case where the gate electrode is arranged below the substrate 18 (a "bottom-gated semiconductor-superconductor hybrid device").

Figure 1:
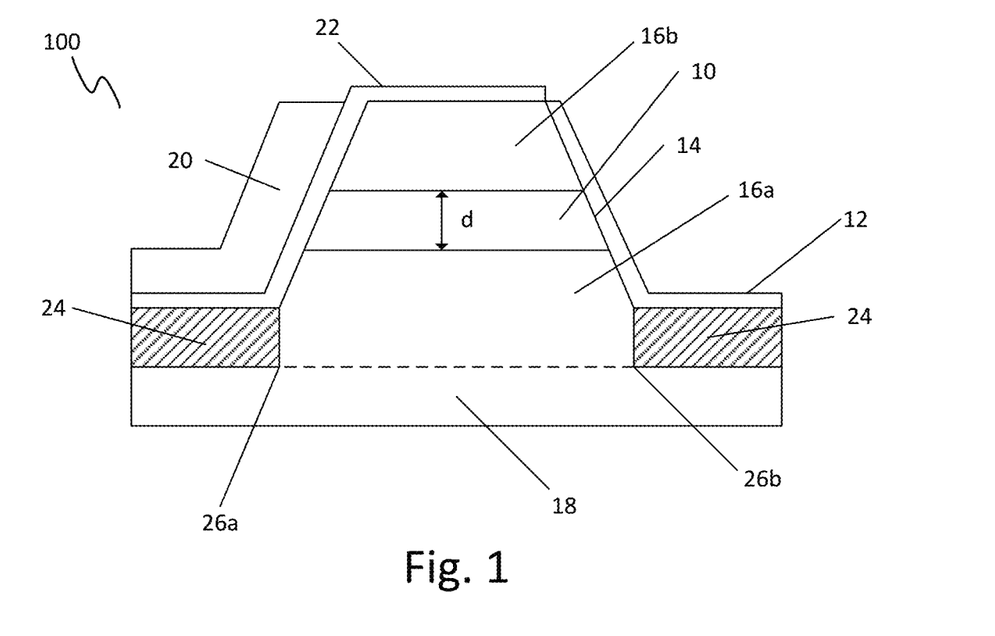
FIG. 1 is a cross-sectional view of one example of a semiconductor-superconductor hybrid device.

In the example illustrated in FIG. 1, gate electrode 20 is depicted as being over the sandwich structure. However, the gate electrode 20 may be spaced from the sandwich structure by an air gap. The air gap, if present, may help to prevent flow of current from the gate electrode to the semiconductor and superconductor components.

Gate electrode 20 is for applying an electrostatic field to the semiconductor layer 10. Providing such gating allows for control over the degree of energy level hybridization between the semiconductor and superconductor. This may be useful for inducing excitations in the device. The configuration of the gate electrode is not particularly limited provided that the gate electrode is capable of gating the device.

FIG. 1 further shows a mask layer 24 arranged on the substrate 18. The present device may be manufactured using selective area growth. Such methods may involve the use of a mask during manufacture of a device. The mask may remain present in the finished device.

A second example of a semiconductor-superconductor hybrid device 200 will now be described in terms of its differences to the first example and with reference to FIG. 2.

The second example differs from the first example in that the second example is a bottom-gated semiconductor-superconductor hybrid device. In this arrangement, a gate electrode 220 is arranged below the substrate 18 and first insulating layer 16a. The substrate 18 and first insulating layer 16a provide electrical insulation between the gate electrode 220 and the semiconductor layer 10. In the second example, the protective layer 22 which was present in the first example is omitted although in variants a protective layer may be provided over all or part of the top surface of the device.

Figure 2:
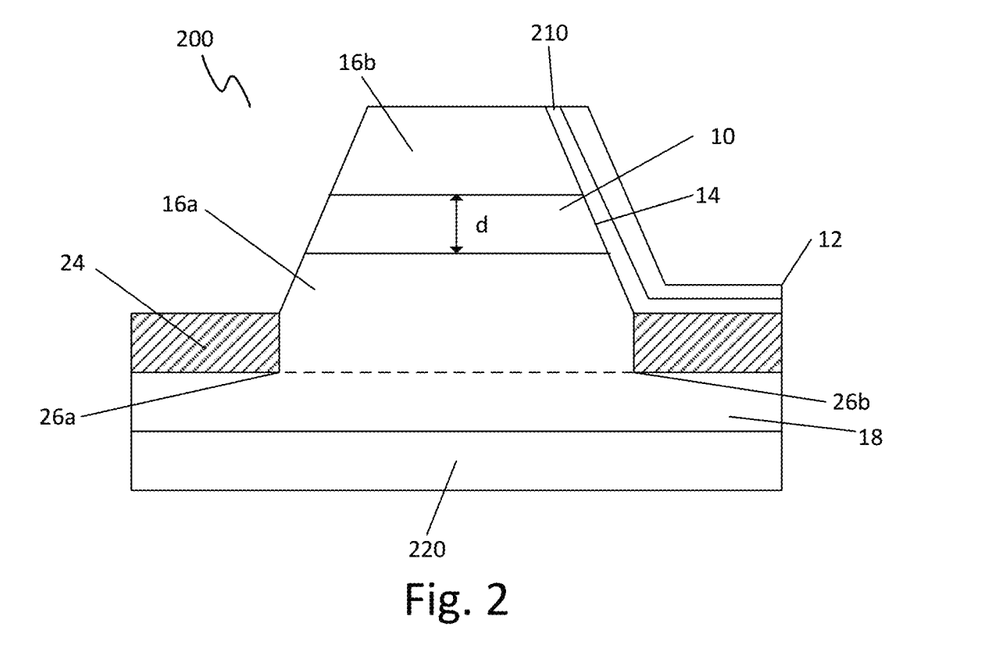
FIG. 2 is a cross-sectional view of another example of a semiconductor-superconductor hybrid device.

The FIG. 2 device further includes a ferromagnetic insulator layer 210 arranged between the semiconductor layer. The ferromagnetic insulator layer may be as described in U.S. patent application Ser. No. 16/246,287, the content of which is hereby incorporated by reference. The ferromagnetic insulator layer may be a layer of a material selected from EuS, GdN, $Y_3Fe_5O_{12}$, $Bi_3Fe_5O_{12}$, $YFeO_3$, $Fe_2O_3$, $Fe_3O_4$, GdN, $Sr_2CrReO_6$, $CrBr_3/CrI_3$, and $YTiO_3$. The ferromagnetic insulator layer is configured to apply a magnetic field to the semiconductor and the superconductor.

Figure 3:
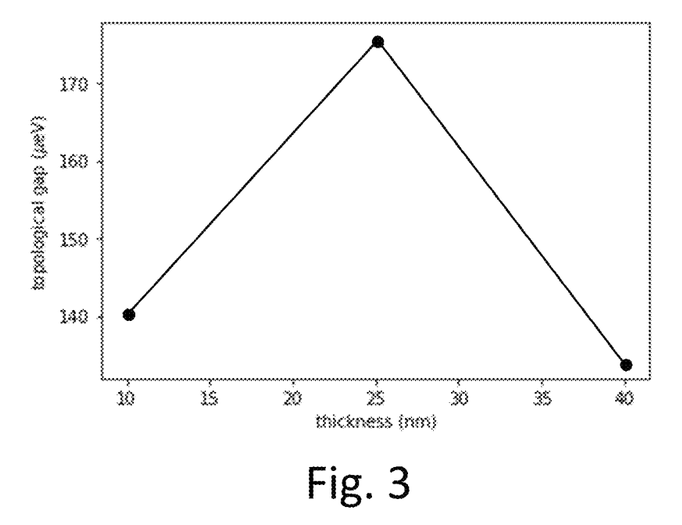
FIG. 3 is a plot showing the calculated variation of the topological gap in μeV as a function of semiconductor layer thickness d for a device in which the band offset (difference in energy level) between the conductance band of the semiconductor and that of the insulating layers is 50 meV and the alpha value (a measure of spin-orbit coupling strength, see Stanescu et al and Winkler et al) is 0.1 eV nm.
Figure 4:
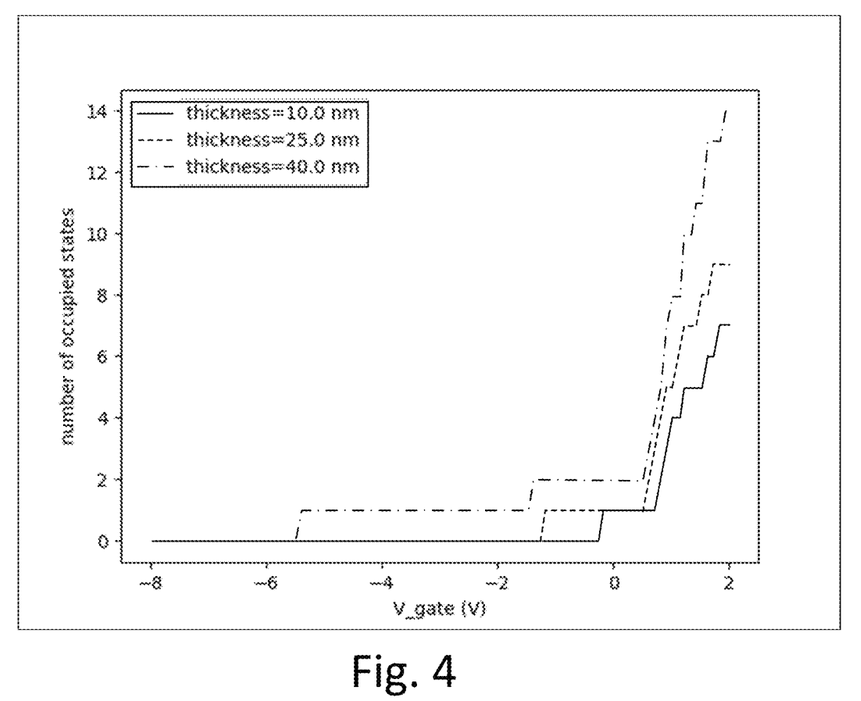
FIG. 4 is a plot showing the calculated number of occupied energy levels at the semiconductor-superconductor interface as a function of applied gate voltage V_gate, for devices having different semiconductor layer thicknesses d.
Figure 5:
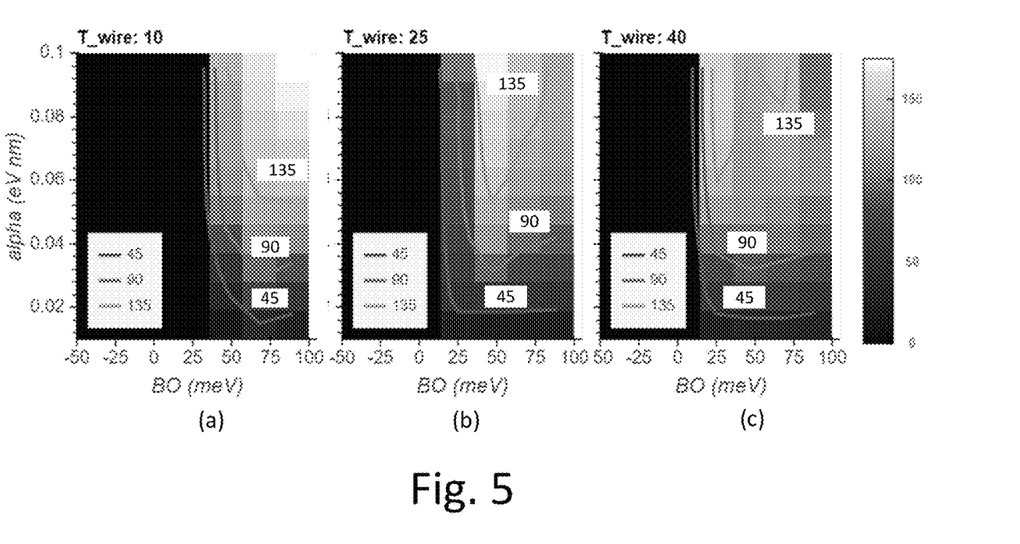
FIG. 5(a) to (c) is a set of heat maps illustrating the topological gap as a function of the band offset and alpha value for devices having semiconductor layer thicknesses of 10 nm, 25 nm, and 40 nm, respectively.

FIGS. 3 to 5 illustrate the effects of varying the thickness d of the semiconductor component of the devices provided herein.

FIG. 3 is a plot showing the calculated topological gap in μeV as a function of semiconductor layer thickness for a conceptual example device having a band offset between the conductance band of the semiconductor and that of the insulating layers is 50 meV and the alpha value (a measure of spin-orbit coupling strength, see Stanescu et al and Winkler et al) is 0.1 eV nm. In this example, the greatest topological gap is achieved for a semiconductor layer thickness of 25 nm. Thus, the topological gap may be optimized by selecting the semiconductor layer thickness.

Illustrative examples of materials for forming an insulating layer which may provide a band offset of at least 50 meV to an InAs semiconductor include materials selected from: (i) indium phosphide; (ii) a material of formula $InAl_xAs_{1-x}$ where x is at least 0.1, e.g. in the range 0.1 to 0.4; and (iii) $InGa_xAs_{1-x}$ where x is at least 0.15, e.g. in the range 0.15 to 0.4.

FIG. 4 is a plot of the number of occupied states against applied gate voltage for devices having varying semiconductor layer thicknesses. This plot shows that the applied gate voltage controls the degree of hybridization between the semiconductor and the superconductor. It is further illustrated that the number of occupied energy states in the device varies depending on the thickness of the semiconductor layer. For example, at a gate voltage V_gate of 2 V, more energy states are occupied in a device having a 40 nm semiconductor layer (dashed-and-dotted line) compared to a device having a 25 nm semiconductor layer (dashed line) or a device having a 10 nm semiconductor layer (solid line).

FIG. 5(a) to (c) is a set of heat maps illustrating the topological gap as a function of the band offset and alpha value for devices having semiconductor layer thicknesses of 10 nm, 25 nm, and 40 nm, respectively. These FIGS. show that the semiconductor layer thickness for obtaining the maximum topological gap varies depending on the properties of the materials selected. For a given value of alpha, when the band offset is large (e.g., greater than 60 meV), a thinner semiconductor layer may be preferred (see FIG. 5(a)), whereas thicker semiconductor layers may be preferable for smaller band offsets (see FIGS. 5(b) and 5(c)).

Figure 6:
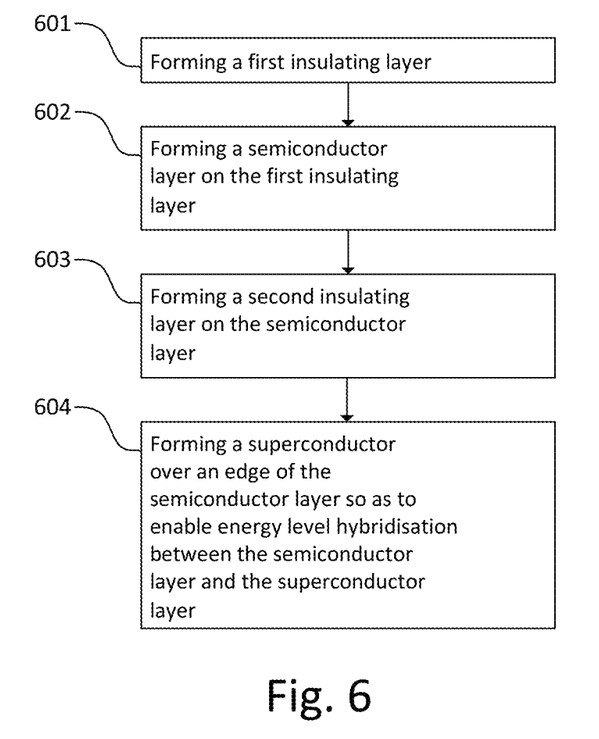
FIG. 6 is a flowchart of a method of manufacturing a semiconductor-superconductor hybrid device.

FIG. 6 is a flowchart outlining steps of an illustrative method for manufacturing a semiconductor-superconductor hybrid device as described herein.

The method generally comprises manufacturing the sandwich structure, and then forming the superconductive components. At block 601, a first insulating layer is formed. At block 602, a semiconductor layer is formed on the first insulating layer. At block 603, a second insulating layer is formed on the semiconductor layer. At block 604, a superconductor is formed over an edge of the semiconductor layer so as to enable energy level hybridisation between the semiconductor layer and the superconductor layer. Additional components may be formed between any of steps 601 to 604, or in subsequent steps.

The specific techniques used to form the various components are not particularly limited, and may be selected as appropriate. Various suitable techniques will be known to the person skilled in the art. Examples include selective area growth; chemical vapour deposition; lithography; and the like. Techniques which result in epitaxial growth of components may allow for good contact between those components, and may be preferred.

Figure 7:
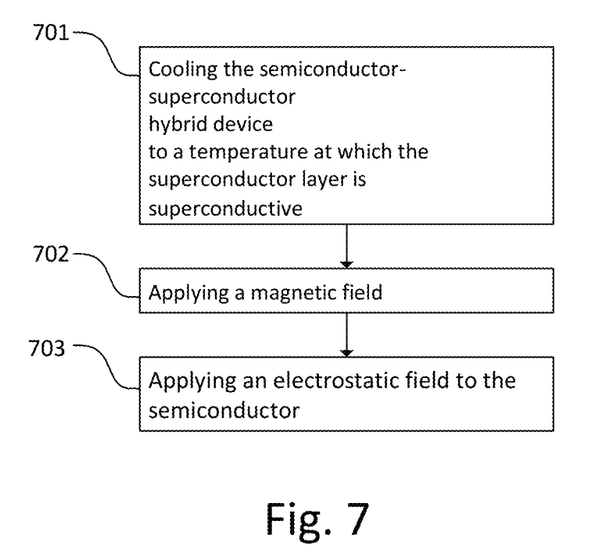
FIG. 7 is a flowchart of a method of using a semiconductor-superconductor hybrid device.

FIG. 7 is a flowchart outlining an illustrative method of using a semiconductor-superconductor hybrid device as provided herein.

Use of the device typically involves inducing topological behaviour, i.e., a particular type of electron excitation, into the device. This is made possible by energy level hybridisation between the semiconductor and the superconductor, creating bands which have a mixture of semiconducting and superconducting character. Hybridisation may also be referred to as "coupling" in the context of the present disclosure. Such excitations may be useful in quantum computing. For example, they may be used to encode a quantum bit (also referred to as a qubit). Without wishing to be bound by theory, it is believed that the semiconductor-superconductor hybrid devices provided herein generate Majorana zero modes.

At block 701, the semiconductor-superconductor hybrid device is cooled to a temperature at which the superconductor layer is superconductive. Put differently, the device is cooled to a temperature below the critical temperature $T_c$ of the superconductor layer such that the layer displays superconductive behaviour (e.g., behaves as if it has zero resistance). Such temperatures are generally of the order of tens of Kelvin or less. $T_c$ depends on the material used, and may in certain cases be influenced by the thickness of the material. The temperature may be selected as appropriate.

At block 702, a magnetic field is applied to the semiconductor layer. The magnetic field lifts spin degeneracy in the device, thereby changing the energy band structure at the interface between the semiconductor and the superconductor. The magnetic field may be applied externally, for example using an electromagnet. Alternatively, in examples where the semiconductor-superconductor hybrid device includes a ferromagnetic insulator layer as described above, the magnetic field may be the magnetic field of the ferromagnetic insulator layer.

At block 703, an electrostatic field is applied to the semiconductor layer. Typically, the semiconductor-superconductor hybrid device includes a gate electrode, and the gate electrode is used to apply the electrostatic field. In alternatives, the electrostatic field may be externally applied. The electrostatic field may vary the degree of energy level hybridisation between the semiconductor and the superconductor. For example, hybridisation may be decreased when electrons are drawn away from the superconductor by the electrostatic field. This may make the low-energy states—i.e., the states of interest—more susceptible to the magnetic field. This may in turn allow a topological phase at smaller magnetic fields, leading to enhanced properties for quantum computation.

It will be appreciated that the above embodiments have been described by way of example only.

More generally, according to one aspect disclosed herein, there is provided a semiconductor-superconductor hybrid device comprising: a semiconductor layer; and a superconductor layer; wherein the superconductor layer is arranged over an edge of the semiconductor layer so as to enable energy level hybridisation between the semiconductor layer and the superconductor layer; wherein the semiconductor layer is arranged in a sandwich structure between first and second insulating layers, each insulating layer being in contact with a respective opposed face of the semiconductor layer. The first and second insulating layers space the semiconductor layer away from corners of the device, and from the surface of any underlying substrate. This may improve the tolerance of the device to manufacturing variations, because the working semiconductor part of the device is remote from portions of the device which are more difficult to manufacture reliably. It may be possible to control precisely the thickness of the semiconductor layer. This may allow control over the number of sub-bands in the device.

The semiconductor-superconductor hybrid device may further comprise a gate electrode for applying an electrostatic field to the semiconductor layer. The structure of the gate electrode is not particularly limited. Examples of materials for forming a gate electrode include those selected from gold, and alloys of gold e.g. gold titanium.

The device may be a side-gated superconductor-semiconductor device. For example, the gate electrode may be arranged over a second edge of the semiconductor layer, and the gate electrode may be spaced from the semiconductor layer by a gate insulating layer for preventing a flow of current from the gate electrode to the semiconductor layer. Side-gated devices may be easier to manufacture than bottom-gated devices. The nature of the insulating layer is not particularly limited provided that it restricts current leakage from the gate electrode to the semiconductor layer. Usefully, the insulating layer may also be configured to protect the device from oxygen and/or water vapour. The insulating layer may comprise an oxide, e.g. hafnium oxide. A top-gated arrangement, in which the gate electrode is arranged over the second insulating layer, is also possible.

Alternatively, the semiconductor-superconductor hybrid device may be bottom-gated. In other words, the gate electrode may be arranged below the first insulating layer. In such an arrangement, a separate gate insulating layer is not necessarily required.

Any of the devices provide herein may include a protective oxide layer, e.g. of hafnium oxide, for protecting one or more parts of the device from water vapour and/or oxygen.

The first insulating layer may extend from a surface of a substrate. For example, the first insulating layer may be formed integrally with the surface of the substrate. In such configurations the first insulating layer spaces the semiconductor layer away from the surface of the substrate and away from corners wherein the substrate meets the first insulating layer. This may allow for improved reproducibility of the semiconductor layer during manufacturing, because corners and/or substrate surfaces may be difficult to reproduce precisely.

The thicknesses of the first and second insulating layer may be independently selected as appropriate. The thickness of each insulating layer may be at least 5 nm, for example, from 5 to 50 nm, or 20 to 50 nm.

The semiconductor layer may have a thickness in the range 5 nm to 50 nm, optionally 10 to 40 nm, further optionally 20 to 30 nm. Varying the thickness of the semiconductor layer may vary the number of occupied energy levels (sub-bands) at the interface between the semiconductor and the superconductor. This is useful for tuning the quantum mechanical behaviour of the device.

The thickness of semiconductor layer may be optimised based on the properties of the materials selected to maximize the topological gap. In one particular example where the band offset between the conductance band of the semiconductor and that of the insulating layers is about 50 meV and the alpha value for the device is 0.1 eV nm, a semiconductor layer thickness in the range 20 to 30 nm, optionally in the range 23 to 27 nm, or of about 25 nm, are particularly preferred. Simulation is one useful method for determining an optimum semiconductor layer thickness for a given device. For example, these ranges may be particularly applicable to arrangements where the semiconductor layer comprises a material of Formula 1 (below), more particularly when the semiconductor layer comprises InAs; and where the first and second insulating layers are of a material selected from: (i) indium phosphide; (ii) a material of formula $InAl_xAs_{1-x}$ where x is at least 0.1, e.g. in the range 0.1 to 0.4; and (iii) a material of formula $InGa_xAs_{1-x}$ where x is at least 0.15, e.g. in the range 0.15 to 0.4.

The semiconductor layer may comprise a material of Formula 1:

$$InAs_xSb_{1-x} \tag{1}$$

where X is in the range 0 to 1, for example in the range 0 to 0.7, more particularly 0.35 to 0.45. The material may be InAs, InSb, or a ternary mixture of In, As and Sb. InAs has good handling properties during manufacture. InSb has excellent electronic properties, e.g. couples particularly well to certain semiconductors, such as Al, but may be more difficult to use in manufacture. Alloys of InAs and InSb have properties in between those of InAs and InSb.

More generally, the principles of the disclosed technology may be applied to any semiconductor, in particular III-V semiconductors.

The first and second insulating layers may be a semiconductor material, the semiconductor material of the first and second insulating layers having a conductance band with an energy level that is at least 30 meV higher, preferably 50 meV higher, more preferably at least 100 meV higher, than a conductance band of a semiconductor material of the semiconductor layer. It may be convenient to use a high band gap semiconductor as the first and second insulating layers. If the conductance band of the material of the insulating layers is at least 50 meV higher than that of the semiconductor layer, flow of electrons from the semiconductor layer to the insulating layer may be prevented.

The first and second insulating layers may be each of a material selected from: indium phosphide, gallium antimonide, indium gallium arsenide, and indium aluminium arsenide. In particular examples, indium phosphide, InP, is used as the insulating material.

Certain examples of materials useful as first and second insulating layers include those of Formula II:

$$InAl_xAs_{1-x}$$

where x is at least 0.1, for example when x is in the range 0.1 to 0.4.

Additional examples of indium gallium arsenide materials useful as first and second insulating layers are those of Formula III:

$$InGa_xAs_{1-x}$$

where x is at least 0.15, e.g. in the range 0.15 to 0.4.

The nature of the superconductor is not particularly limited, and may be selected as appropriate. The superconductor is typically an s-wave superconductor. Any of the various s-wave superconductors known the art may be used. Examples include aluminium and lead, with aluminium being preferred.

The thickness of the superconductor may likewise be selected as appropriate. An illustrative thickness range is 4 nm to 10 nm.

In an example, the semiconductor layer is of a material of Formula 1, preferably InSb, and the first and second insulating layers are of a material selected from indium phosphide, indium gallium arsenide (e.g., an indium gallium arsenide of Formula III), and indium aluminium arsenide (e.g. an indium aluminium arsenide of Formula II), preferably indium phosphide. In this example, the superconductor is preferably aluminium.

In another example, the semiconductor material is InAs and the first and second insulating layers are of a material selected from indium phosphide, indium gallium arsenide (e.g., an indium gallium arsenide of Formula III), and indium aluminium arsenide (e.g., an indium aluminium arsenide of Formula II), preferably indium phosphide. In this example, the superconductor is preferably aluminium.

In another example, the semiconductor layer is of a material of Formula 1, and the insulating layers are of gallium antimonide, GaSb.

The semiconductor-superconductor hybrid device may further comprise a layer of a ferromagnetic insulator arranged between the superconductor and the semiconductor. Examples of suitable ferromagnetic insulators include materials selected from EuS, GdN, $Y_3Fe_5O_{12}$, $Bi_3Fe_5O_{12}$, $YFeO_3$, $Fe_2O_3$, $Fe_3O_4$, GdN, $Sr_2CrReO_6$, $CrBr_3/CrI_3$, and $YTiO_3$. Uses of the device typically include applying a magnetic field to the semiconductor layer. The inclusion of a ferromagnetic insulator may avoid the need to apply the magnetic field using an external apparatus.

The semiconductor-superconductor hybrid devices provided herein may be configured as nanowires. The semiconductor-superconductor hybrid devices provided herein may be incorporated into a quantum computer device.

It is to be understood that the above-described features may be used in any combination.

Also provided herein is a method of manufacturing a semiconductor-superconductor hybrid device, which method comprises: forming a first insulating layer; forming a semiconductor layer on the first insulation layer; forming a second insulating layer on the semiconductor layer; and forming a superconductor layer over an edge of the semiconductor layer so as to enable energy level hybridisation between the semiconductor layer and the superconductor layer. Since the semiconductor layer is spaced away from corners and the top and bottom of the device, better control over the geometry of the semiconductor layer may be achieved. This may improve the reliability of the method.

The specific techniques used to form the various components may be selected as appropriate. For example, at least one of the first insulating layer, the second insulating layer, and the semiconductor layer may be formed by selective area growth. Selective area growth, and other techniques involving epitaxial crystal growth, allow very close contact between components. In the case of the semiconductor and superconductor, epitaxial growth may allow for improved energy level hybridisation.

The method may further comprise forming any of the various additional components described above with reference to the device. For example, the method may further comprise forming a gate electrode for applying an electrostatic field to the semiconductor layer.

The semiconductor layer may have a thickness in the range 10 to 50 nm. As described above, thicknesses in this range allow for control over the number of occupied bands when the device is in use.

The semiconductor layer may comprise a material of general formula:

$$InAs_xSb_{1-x}$$

where X is in the range of 0 to 1. The first and second insulating layers may each be of a material selected from: indium phosphide, indium gallium arsenide, and indium aluminium arsenide. More generally, it is to be understood that the method may be practiced using any of the various materials (or combinations of materials) described above with reference to the device.

Further provided is a method of inducing topological behaviour in a semiconductor-superconductor hybrid device as provided herein, which method comprises: cooling the semiconductor-superconductor hybrid device to a temperature at which the superconductor layer is superconductive; applying a magnetic field to the semiconductor layer and the superconductor layer; and applying an electrostatic field to the semiconductor layer. The method may comprise inducing an anyon, especially a Majorana zero mode, in the semiconductor-superconductor hybrid device. Without wishing to be bound by theory, a device as provided herein may be capable of generating a Majorana zero mode. The device may be useful in a quantum computer, more particularly a topological quantum computer.

The present disclosure provides the following clauses:

Clause 1. Semiconductor-superconductor hybrid device comprising: a semiconductor layer; and a superconductor layer; wherein the superconductor layer is arranged over an edge of the semiconductor layer so as to enable energy level hybridisation between the semiconductor layer and the superconductor layer; and wherein the semiconductor layer is arranged in a sandwich structure between first and second insulating layers, each insulating layer being in contact with a respective opposed face of the semiconductor layer.

Clause 2. The semiconductor-superconductor hybrid device according to Clause 1, further comprising a gate electrode for applying an electrostatic field to the semiconductor layer.

Clause 3. The semiconductor-superconductor hybrid device according to Clause 2, wherein the gate electrode is arranged over a second edge of the semiconductor layer, and wherein the gate electrode is spaced from the semiconductor layer by a gate insulating layer for preventing a flow of current from the gate electrode to the semiconductor layer.

Clause 4. The semiconductor-superconductor hybrid device according to Clause 2, wherein the gate electrode is arranged below the first insulating layer.

Clause 5. The semiconductor-superconductor hybrid device according to any of Clauses 1 to 4, wherein the first insulating layer extends from a surface of a substrate.

Clause 6. The semiconductor-superconductor hybrid device according to Clause 5, wherein the first insulating layer is formed integrally with the surface of the substrate.

Clause 7. The semiconductor-superconductor hybrid device according to any of Clauses 1 to 6, wherein the semiconductor layer has a thickness in the range 5 nm to 50 nm.

Clause 8. The semiconductor-superconductor hybrid device according to any of Clauses 1 to 7, wherein the semiconductor layer comprises a material of general formula:

$$InAs_xSb_{1-x}$$

where X is in the range 0 to 1.

Clause 9. The semiconductor-superconductor hybrid device according to any of Clauses 1 to 8, wherein the first and second insulating layers are of a semiconductor material, the semiconductor material of the first and second insulating layers having a conductance band with an energy level that is at least 50 meV higher than a conductance band of a semiconductor material of the semiconductor layer.

Clause 10. The semiconductor-superconductor hybrid device according to any of Clauses 1 to 9, wherein the first and second insulating layers are each of a material selected from: indium phosphide, gallium antimonide, indium gallium arsenide, and indium aluminium arsenide.

Clause 11. The semiconductor-superconductor hybrid device according to any of Clauses 1 to 10, further comprising a layer of a ferromagnetic insulator arranged between the superconductor layer and the semiconductor layer.

Clause 12. A quantum computer device including a semiconductor-superconductor hybrid device according to any of Clauses 1 to 11.

Clause 13. A method of manufacturing a semiconductor-superconductor hybrid device, which method comprises: forming a first insulating layer; forming a semiconductor layer on the first insulation layer; forming a second insulating layer on the semiconductor layer; and forming a superconductor layer over an edge of the semiconductor layer so as to enable energy level hybridisation between the semiconductor layer and the superconductor layer.

Clause 14. The method according to Clause 13, further comprising forming a gate electrode for applying an electrostatic field to the semiconductor layer.

Clause 15. The method according to Clause 13 or Clause 14, wherein at least one of the first insulating layer, the second insulating layer, and the semiconductor layer is formed by selective area growth.

Clause 16. The method according to any of Clauses 13 to 15, wherein the semiconductor layer has a thickness in the range 10 to 50 nm.

Clause 17. The method according to any of Clauses 13 to 16, wherein the semiconductor layer comprises a material of general formula:

$$InAs_xSb_{1-x}$$

where X is in the range of 0 to 1.

Clause 18. The method according to any of Clauses 13 to 17, wherein the first and second insulating layers are each of a material selected from: indium phosphide, indium gallium arsenide, and indium aluminium arsenide.

Clause 19. A method of inducing topological behaviour in the semiconductor-superconductor hybrid device according to any of Clauses 1 to 11, which method comprises: cooling the semiconductor-superconductor hybrid device to a temperature at which the superconductor layer is superconductive; applying a magnetic field to the semiconductor layer and the superconductor layer; and applying an electrostatic field to the semiconductor layer.

Clause 20. The method according to Clause 19, wherein the topological behaviour comprises a Majorana zero mode.

Other variants or use cases of the disclosed techniques may become apparent to the person skilled in the art once given the disclosure herein. The scope of the disclosure is not limited by the described embodiments but only by the accompanying claims.

What is claimed is:

1. A semiconductor-superconductor hybrid device comprising:
   a semiconductor material layer;
   a superconductor material layer;
   wherein the superconductor material layer is arranged over a layer of a ferromagnetic insulator material arranged between the superconductor material layer and the semiconductor material layer, the layer of ferromagnetic insulator material contacting a side of the semiconductor material layer; and
   wherein the semiconductor material layer is arranged in a sandwich structure between first and second insulating layers, each insulating layer being in contact with a respective opposed face of the semiconductor material layer and wherein the layer of ferromagnetic insulator material and the superconductor material layer extend along the first and second insulating layers and wherein one of the first and second insulating layers spaces the semiconductor material layer away from a surface of an underlying substrate associated with the semiconductor-superconductor hybrid device.

2. The semiconductor-superconductor hybrid device according to claim 1, wherein the first insulating layer extends from the surface of the underlying substrate.

3. The semiconductor-superconductor hybrid device according to claim 2, wherein the first insulating layer is formed integrally with the surface of the underlying substrate.

4. The semiconductor-superconductor hybrid device according to claim 1, wherein the semiconductor material layer has a thickness in the range 5 nm to 50 nm.

5. The semiconductor-superconductor hybrid device according to claim 1, wherein the semiconductor material layer comprises a material of general formula: $InAs_xSb_{1-x}$, where X is in the range 0 to 1.

6. The semiconductor-superconductor hybrid device according to claim 1, wherein the first and second insulating layers are of a semiconductor material which becomes insulating as cooled, the semiconductor material of the first and second insulating layers having a conductance band with an energy level that is at least 50 meV higher than a conductance band of a semiconductor material of the semiconductor layer.

7. The semiconductor-superconductor hybrid device according to claim 1, wherein the first and second insulating layers are each of a material which becomes insulating as cooled, the material selected from: indium phosphide, gallium antimonide, indium gallium arsenide, and indium aluminium arsenide.

8. The semiconductor-superconductor hybrid device of claim 1, wherein the semiconductor material layer is $InAs_xSb_{1-x}$, where x is in the range 0 to 1, the superconductor material is aluminium or $InAs_ySb_y$, wherein y is in a range of 0 to 1, the ferromagnetic insulator layer comprises EuS, GdN, $Y_3Fe_5O_{12}$, $Bi_3Fe_5O_{12}$, $YFeO_3$, $Fe_2O_3$, $Fe_3O_4$, GdN, $Sr_2CrReO_6$, $CrBr_3/CrI_3$, or $YTiO_3$, and the first and second insulating layers are selected from indium phosphide, gallium antimonide, indium gallium arsenide, and indium aluminium arsenide.

9. A semiconductor-superconductor hybrid device comprising:
   a semiconductor material layer;
   a superconductor material layer;
   wherein the superconductor material layer is arranged over a layer of a ferromagnetic insulator material arranged between the superconductor material layer and the semiconductor material layer, the layer of ferromagnetic insulator material contacting a side of the semiconductor material layer to enable energy level hybridisation between the semiconductor material layer and the superconductor material layer when the superconductor material layer is cooled to become superconducting; and
   wherein the semiconductor material layer is arranged in a sandwich structure between first and second insulating layers, each insulating layer being in contact with a respective opposed face of the semiconductor material layer and wherein the layer of ferromagnetic insulator material and the superconductor material layer extend along the first and second insulating layers and wherein one of the first and second insulating layers spaces the semiconductor material layer away from a surface of an underlying substrate associated with the semiconductor-superconductor hybrid device.

10. The semiconductor-superconductor hybrid device according to claim 9, wherein the first insulating layer extends from the surface of the underlying substrate.

11. The semiconductor-superconductor hybrid device according to claim 10, wherein the first insulating layer is formed integrally with the surface of the underlying substrate.

12. The semiconductor-superconductor hybrid device according to claim 9, wherein the semiconductor material layer has a thickness in the range 5 nm to 50 nm.

13. The semiconductor-superconductor hybrid device according to claim 9, wherein the semiconductor material layer comprises a material of general formula: $InAs_xSb_{1-x}$, where X is in the range 0 to 1.

14. The semiconductor-superconductor hybrid device according to claim 9, wherein the first and second insulating layers are of a semiconductor material which becomes insulating as cooled, the semiconductor material of the first and second insulating layers having a conductance band with an energy level that is at least 50 meV higher than a conductance band of a semiconductor material of the semiconductor layer.

15. The semiconductor-superconductor hybrid device according to claim 9, wherein the first and second insulating layers are each of a material which becomes insulating as cooled, the material selected from indium phosphide, gallium antimonide, indium gallium arsenide, and indium aluminium arsenide.

16. The semiconductor-superconductor hybrid device of claim 9, wherein the semiconductor material layer is $InAs_xSb_{1-x}$, where x is in the range 0 to 1, the superconductor material is aluminium or $InAs_ySb_y$, wherein y is in a range of 0 to 1, the ferromagnetic insulator layer comprises EuS, GdN, $Y_3Fe_5O_{12}$, $Bi_3Fe_5O_{12}$, $YFeO_3$, $Fe_2O_3$, $Fe_3O_4$, GdN, $Sr_2CrReO_6$, $CrBr_3/CrI_3$, or $YTiO_3$, and the first and second insulating layers are selected from indium phosphide, gallium antimonide, indium gallium arsenide, and indium aluminium arsenide.

* * * * *